(12) United States Patent
Isami et al.

(10) Patent No.: US 8,248,569 B2
(45) Date of Patent: Aug. 21, 2012

(54) DISPLAY DEVICE

(75) Inventors: Hironobu Isami, Chiba (JP); Tatsuo Makishima, Tokyo (JP)

(73) Assignees: Hitachi Displays, Ltd., Chiba-ken (JP); Panasonic Liquid Crystal Display Co., Ltd., Hyogo-Ken (JP)

( * ) Notice: Subject to any disclaimer, the term of this patent is extended or adjusted under 35 U.S.C. 154(b) by 0 days.

(21) Appl. No.: 12/926,408

(22) Filed: Nov. 16, 2010

(65) Prior Publication Data

US 2011/0062582 A1    Mar. 17, 2011

Related U.S. Application Data

(63) Continuation of application No. 12/078,397, filed on Mar. 31, 2008, now Pat. No. 7,859,634.

(30) Foreign Application Priority Data

Apr. 3, 2007   (JP) ................................. 2007-097198

(51) Int. Cl.
   *G02F 1/1345* (2006.01)
(52) U.S. Cl. ......... 349/152; 349/149; 349/150; 349/151
(58) Field of Classification Search ........... 349/149–152
See application file for complete search history.

(56) References Cited

U.S. PATENT DOCUMENTS

| | | | |
|---|---|---|---|
| 4,764,804 A | 8/1988 | Sahara et al. | |
| 6,215,321 B1 | 4/2001 | Nakata | |
| 6,995,474 B1 | 2/2006 | Ho et al. | |
| 7,084,500 B2 * | 8/2006 | Swnson et al. | 257/738 |
| 7,566,585 B2 | 7/2009 | Theuss | |
| 2002/0122143 A1 | 9/2002 | Woo et al. | |
| 2005/0017336 A1 * | 1/2005 | Kung et al. | 257/685 |
| 2008/0001233 A1 | 1/2008 | Kapoor et al. | |

FOREIGN PATENT DOCUMENTS

| | | |
|---|---|---|
| JP | 2000-208907 | 7/2000 |
| JP | 2002-258317 | 9/2002 |

* cited by examiner

*Primary Examiner* — Phu Vu
(74) *Attorney, Agent, or Firm* — Stites & Harbison, PLLC; Juan Carlos A. Marquez, Esq (57) ABSTRACT

A display device includes a display panel, and a semiconductor chip having plural bump electrodes and mounted on a substrate constituting the display panel. The plural bump electrodes include a first bump electrode arranged in the vicinity of a center for a longitudinal direction of the semiconductor chip, and a second bump electrode arranged in the vicinity of an end portion in the longitudinal direction of the semiconductor chip. The semiconductor chip has one or more than one conductive layer inside. Assuming that a surface of the semiconductor chip having the bump electrodes formed thereon is a lower side, the number of the conductive layers formed on the second bump electrode is greater than the number of the conductive layers formed on the first bump electrode. The conductive layer formed on the first and the second bump electrode includes a dummy conductive layer. Further, the plural bump electrodes are electrically connected to a wiring layer formed on a substrate constituting the display panel through an anisotropic conductive film.

2 Claims, 11 Drawing Sheets

DISPLAY DEVICE

CROSS-REFERENCE TO RELATED APPLICATION

This application is a Continuation of U.S. patent application Ser. No. 12/078,397 filed Mar. 31, 2008 now U.S. Pat. No. 7,859,634. The present application claims priority from U.S. patent application Ser. No. 12/078,397 filed Mar. 31, 2008, which claims priority from Japanese Application No. 2007-097198 filed on Apr. 3, 2007, the contents of which are hereby incorporated by reference into this application.

BACKGROUND OF THE INVENTION

1. Field of the Invention

The present invention relates in general to a display device, more specifically, to an effective technique to be applied to a chip-on-glass (COG) type display device.

2. Description of the Related Arts

Thin Film Transistor (TFT) type liquid crystal display devices are broadly used for laptop computers or TV panels. These liquid crystal display devices include respectively a liquid crystal display panel, and a semiconductor chip mounted with a drive circuit (e.g., a gate driver circuit or a source driver circuit) for driving the liquid crystal display panel.

Such a liquid crystal display device adopts a chip-on-glass (COG) method in which sleeve semiconductor chips are mounted directly on one of a pair of substrates that constitute a liquid crystal display panel. A variety of semiconductor chip mounting schemes based on this COG method have been suggested and put to practical use. One of them is ACF mounting in which an anisotropic conductive film (ACF) is used to mount a semiconductor chip. According to the ACF mounting, wiring lines (or simply wires) formed at one of a pair of substrates constituting a liquid crystal display panel are electrically and mechanically connected to a bump electrode formed on the principal surface of a semiconductor chip by way of an anisotropic conductive film. One example for obtaining the anisotropic conductive film is to disperse and mix a plenty of conductive particles into an epoxy based thermosetting insulation resin.

A COG type liquid crystal display device is described in JP-A-2002-258317.

Figure 10:
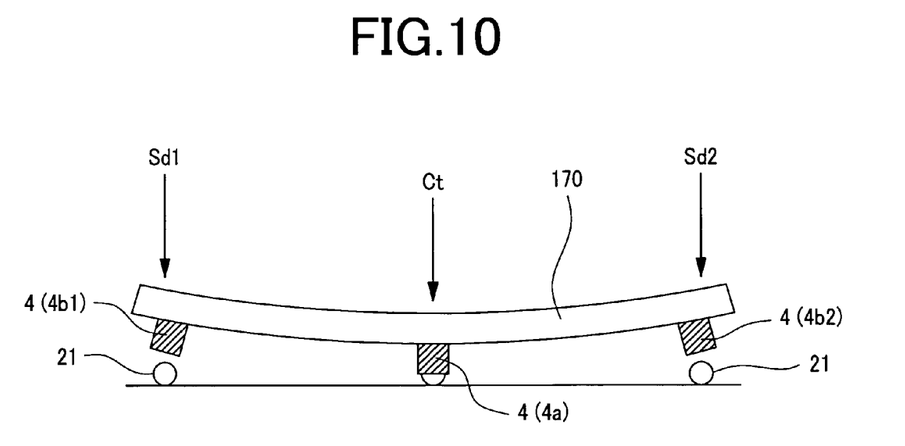
FIG. 10 is a drawing to explain a warpage state of a semiconductor chip in a related art.

In the ACF mounting, an ACF is interposed and heated between one substrate of a liquid crystal display panel and a semiconductor chip 170 to compress the semiconductor chip 170, and conductive particles 21 in the ACF are inserted between wiring lines of the substrate and bump electrodes 4 of the semiconductor chip 170 to connect both (the wiring lines and the bump electrodes) electrically and mechanically. It is therefore necessary to align the bump electrodes 4 of the semiconductor chip 170 to a uniform height, namely, planarizing the plural bump electrodes. However, as shown in FIG. 10 (this is a drawing for explaining a semiconductor chip warpage phenomenon in a related art), the principal surface of the semiconductor chip 170 (i.e. the bump formation surface where bump electrodes 4 are formed) is warped in a convex manner. In result of the warpage, a bump electrode 4a arranged in the vicinity of the center for the longitudinal direction of the semiconductor chip 170 has a different height from bump electrodes 4b1 and 4b2 that are arranged in the vicinities of end portions (an end portion of one side Sd1 and an end portion of the other side Sd2), respectively. Since the bump electrodes 4 with nonuniform heights cause connection failure between the wiring lines on a substrate and the bump electrodes of a semiconductor chip, or unstable connection resistance therebetween (between the wiring lines and the bump electrodes) and degrade the reliability of a liquid crystal display device, there is a need to develop a technique to resolve these deficiencies.

SUMMARY OF THE INVENTION

Accordingly, the present invention is directed to a technique for improving reliability of a display device.

In accordance with the above-described object, there is provided a display device including a display panel, and a semiconductor chip having plural bump electrodes and mounted on a substrate constituting the display panel, in which the plural bump electrodes include a first bump electrode arranged in the vicinity of a center for a longitudinal direction of the semiconductor chip, and a second bump electrode arranged in the vicinity of an end portion in the longitudinal direction of the semiconductor chip; and in which the semiconductor chip has one or more than one conductive layer inside and, assuming that a surface of the semiconductor chip having the bump electrodes formed thereon is a lower side, the number of the conductive layers formed on the second bump electrode is greater than the number of the conductive layers formed on the first bump electrode.

In an exemplary embodiment, height from a surface of the semiconductor chip where the bump electrodes are not formed to the top of the second bump electrode is greater than height from a surface of the semiconductor chip where the bump electrodes are not formed to the top of the first bump electrode.

In an exemplary embodiment, the bump electrode formation surface of the semiconductor is warped in a convex direction.

Another aspect of the present invention provides a display device including a display panel, and a semiconductor chip having plural bump electrodes and mounted on a substrate constituting the display panel, wherein the semiconductor chip has one or more than one conductive layer inside; in which each of the plural bump electrodes is arranged at center and at peripheral portions of the center, respectively, the center being higher than the peripheral portions; and in which, assuming that a surface of the semiconductor chip having the bump electrodes formed thereon is a lower side, the number of the conductive layers formed on the peripheral portions of the bump electrodes is greater than the number of the conductive layers formed on the center of the bump electrodes.

In an exemplary embodiment, the conductive layer formed on the first and the second bump electrode includes a dummy conductive layer.

In an exemplary embodiment, the plural bump electrodes are electrically connected to a wiring layer formed on a substrate constituting the display panel through an anisotropic conductive film.

To be brief on the major advantage of an exemplary embodiment of the present invention, a highly reliably display device can be achieved.

The other objectives and advantages of the invention will be understood by the following description and accompanying drawings and will also be appreciated by the embodiments of the invention more clearly. Further, the objectives and advantages of the invention will readily be seen that they can be realized by the means and its combination specified in the claims.

DETAILED DESCRIPTION OF THE PREFERRED EMBODIMENT

A preferred embodiment of the present invention implemented in a liquid crystal display device will now be described with reference to the accompanying drawings.

In the following description, the same drawing reference numerals are used for the same elements even in different drawings. While the present invention has been described with respect to the specific embodiments, it will be apparent to those skilled in the art that various changes and modifications may be made without departing from the spirit and scope of the invention.

Embodiment 1

Figure 1:
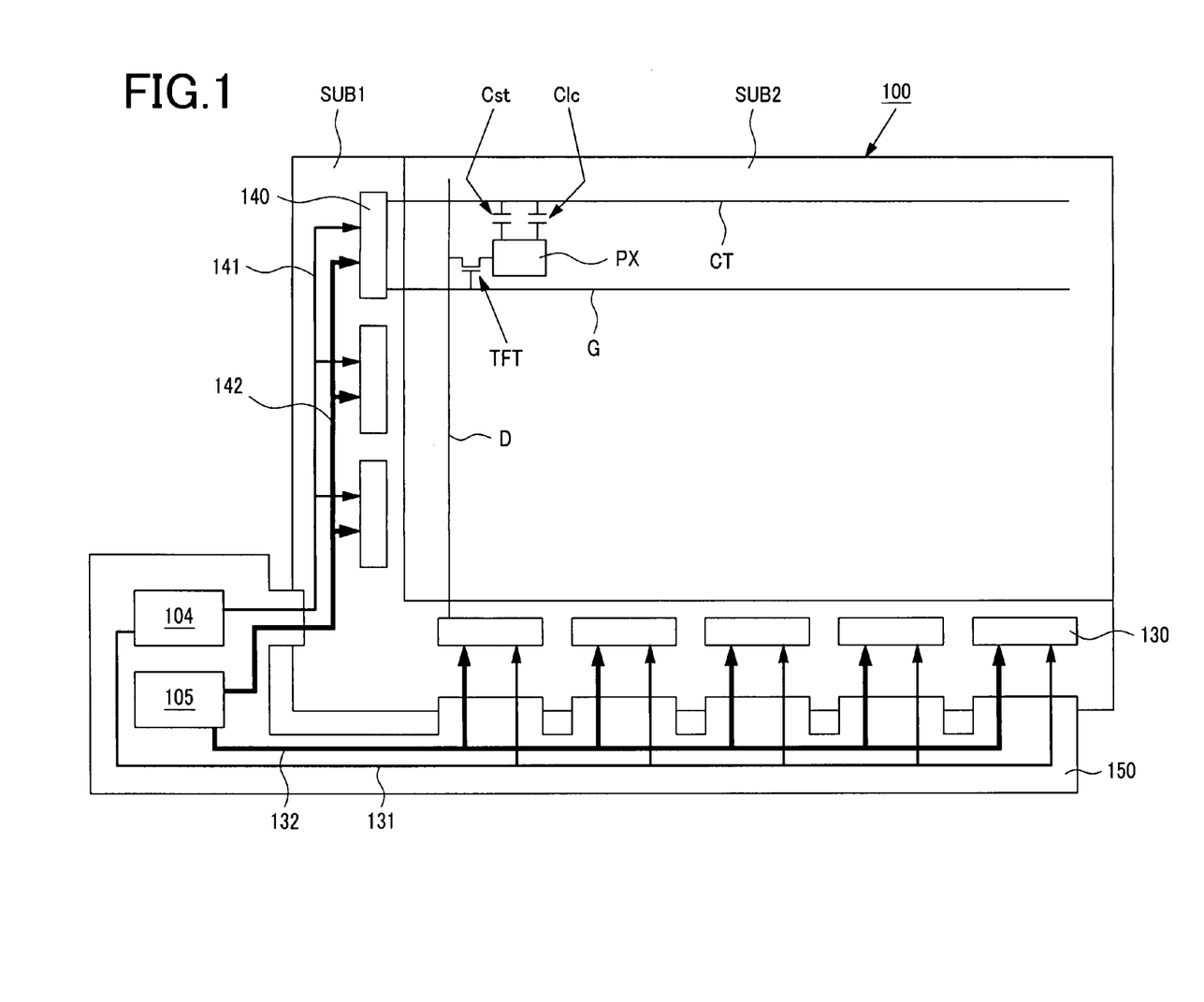
FIG. 1 is a schematic block diagram illustrating the structure of a liquid crystal display device in accordance with an embodiment 1 of the present invention.

FIG. 1 is a schematic block diagram illustrating the structure of a liquid crystal display device in accordance with an embodiment 1 of the present invention.

In FIG. 1, reference numeral 100 designates a liquid crystal display panel, 130 a source driver constituted by a semiconductor chip, 140 a gate driver constituted by a semiconductor chip, 104 a display control circuit, and 105 a power supply circuit, respectively.

The liquid crystal display panel 100 is an IPS (In-Plane Switching) type liquid crystal display panel which is constituted as follows. A first substrate (also called a TFT substrate) SUB1 on which pixel electrodes PX, a thin film transistor TFT, a counter electrode CT, etc., are formed, and a second substrate (also called a CF substrate) SUB2 on which a color filter, etc., is formed are laminated, leaving a predetermined space therebetween. These two substrates are bonded together by an encompassing band (e.g., case) shape sealing material applied to a peripheral portion between the substrates, and, at the same time, liquid crystal molecules are sealed into the sealing material between the two substrates from a liquid crystal enclosure provided at a part of the sealing material. Then polarizers are attached outside the substrates. In short, the liquid crystal display panel 100 is composed of a pair of substrates, and a liquid crystal layer including a large number of liquid crystal molecules inserted between the substrates. Besides the IPS liquid crystal display panel, a TN mode or VA mode liquid crystal display panel controlled by a vertical electric field may also be used. In this case, the counter electrode CT is installed at the second substrate SUB2.

Since the present invention is not related to the internal structure of a liquid crystal display panel, no details on the internal structure of the liquid crystal display panel will be provided.

The first substrate SUB1 and the second substrate SUB2 are formed into square shaped planes of different sizes. In this embodiment, planar size of the first substrate SUB1 is larger than that of the second substrate SUB2, and the first substrate SUB1 has an area that is not overlapped with the second substrate SUB2 (hereinafter, referred to as a non-overlapped area). The first and second substrates SUB1 and SUB2 are preferably transparent insulating substrates made of glass for example.

The source driver 130 and the gate driver 140 are mounted on the non-overlapped area in the vicinities of two sides of the first substrate SUB1 for example, by the COG method, respectively.

Moreover, the power supply circuit 105 and the display control circuit 104 are mounted respectively to a flexible wiring substrate (hereinafter, referred to as an FCP substrate) 150 that is arranged in the vicinity of the liquid crystal display 100.

A digital signal 131 (display data signal, clock signal, etc.) sent out from the display control circuit 104, and all kinds of power supplies 132 (analog power supply/GND, digital power supply/GND, gray reference voltage, etc.) supplied from the power supply circuit 105 are input to respective source drivers 130 through signal wiring lines formed on the FPC substrate 150.

Meanwhile, a digital signal 141 (clock signal, etc.) sent out from the display control circuit 104, and all kinds of power supplies 142 (analog power supply/GND, digital power supply/GND, etc.) supplied from the power supply circuit 105 are input to respective gate drivers 140 through signal wiring lines formed on the FPC substrate 150 and the first substrate SUB1.

Referring to FIG. 1, D designates a video signal line (also called a drain line or a source line0, G designates a scanning line (also called a gate line0, Clc (cholesteric liquid crystal) designates a liquid crystal capacity which transparently shows a liquid crystal layer, and Cst designates a sustain capacity formed between the counter electrode CT and the pixel electrode PX.

In FIG. 1, sub-pixels, each having one thin film transistor (TFT), are arranged in a matrix shape at an effective display region (pixel portion).

Figure 2:
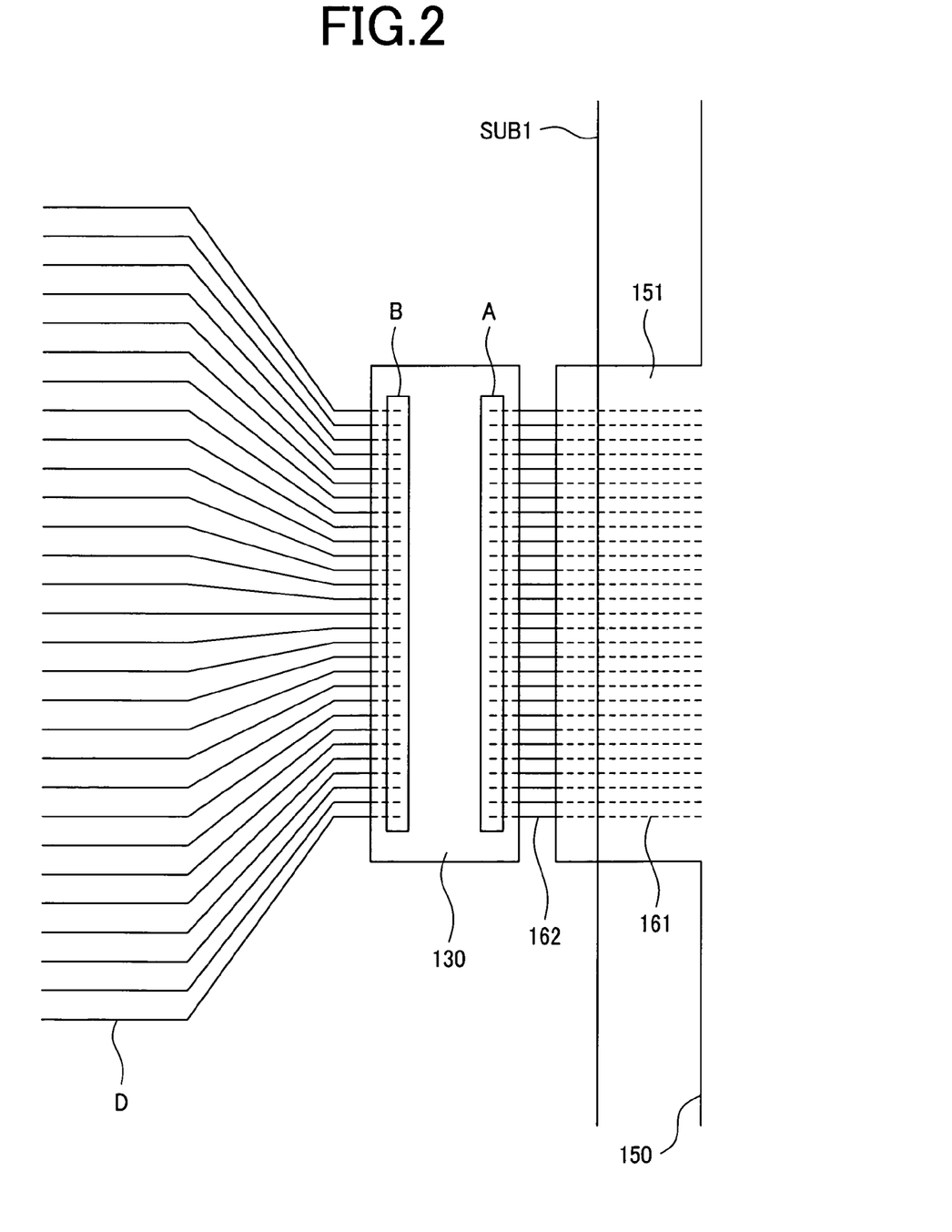
FIG. 2 is a drawing to explain wiring lines formed on a substrate mounted with a source driver (semiconductor chip) thereon, in accordance with the liquid crystal display device of FIG. 1.

FIG. 2 is a drawing to explain a wiring layer of a substrate to which the source driver 130 of the embodiment 1 is mounted.

As shown in FIG. 2, an output wiring line 161 formed on a prominent portion 151 of the FPC substrate 150 is electrically and mechanically connected to an input wiring line 162 formed on the first substrate SUB1 by way of an anisotropic conductive film.

Moreover, the input wiring line 162 formed on the first substrate SUB1 is electrically and mechanically connected to an input bump electrode of the source driver 130 by way of an anisotropic conductive film, and the output bump electrode of the source driver 130 is electrically and mechanically connected to a video signal line D by way of an anisotropic conductive film.

Further, in FIG. 2, A designates an area where the input bump electrode of the source driver 130 is formed, and B designates an area where the output bump electrode of the source driver 130 is formed.

Figure 3:
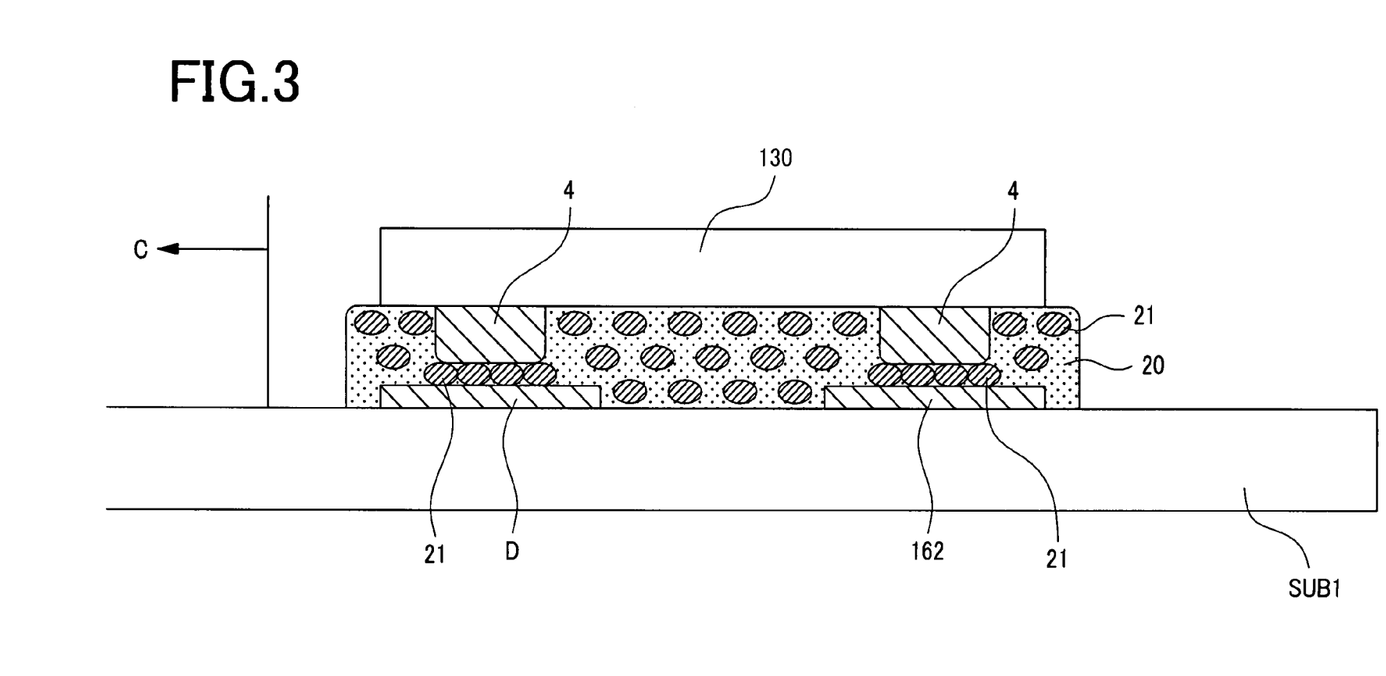
FIG. 3 is a cross-sectional view of a principal part to explain one mounting arrangement of the source driver, in accordance with the liquid crystal display device of FIG. 1.

FIG. 3 is a cross-sectional view of a principal part to explain one mounting arrangement of the source driver 130 in the embodiment 1. In FIG. 3, the direction indicated by an arrow C becomes a display area.

As shown in FIG. 3, the source driver 13Q is mounted onto the first substrate SUB1 in a manner that its principal surface (the bump formation surface where bump electrodes 4 are formed) faces the first substrate SUB1 of the liquid crystal display 100, that is, the plural bump electrodes 4 of the source driver 130 are opposite to plural wiring lines 162 (D) of the first substrate SUB1.

An adhesive such as an anisotropic conductive film (called ACF) is interposed between the first substrate SUB1 and the source driver 130. One example for obtaining the anisotropic conductive film 20 is to disperse and mix a large number of conductive particles 21 into an epoxy based thermosetting insulation resin. Namely, the source driver 130 is mounted to the first substrate SUB1 by ACF mounting which uses the ACF 20 to mount a semiconductor chip. In the ACF mounting, the ACF 20 is interposed and heated between the first substrate SUB1 and the source driver 130, and those conductive particles 21 in the ACF are inserted between the bump electrodes 4 of the source driver 130 to connect both (the wiring lines and the bump electrodes) electrically and mechanically.

Figure 4:
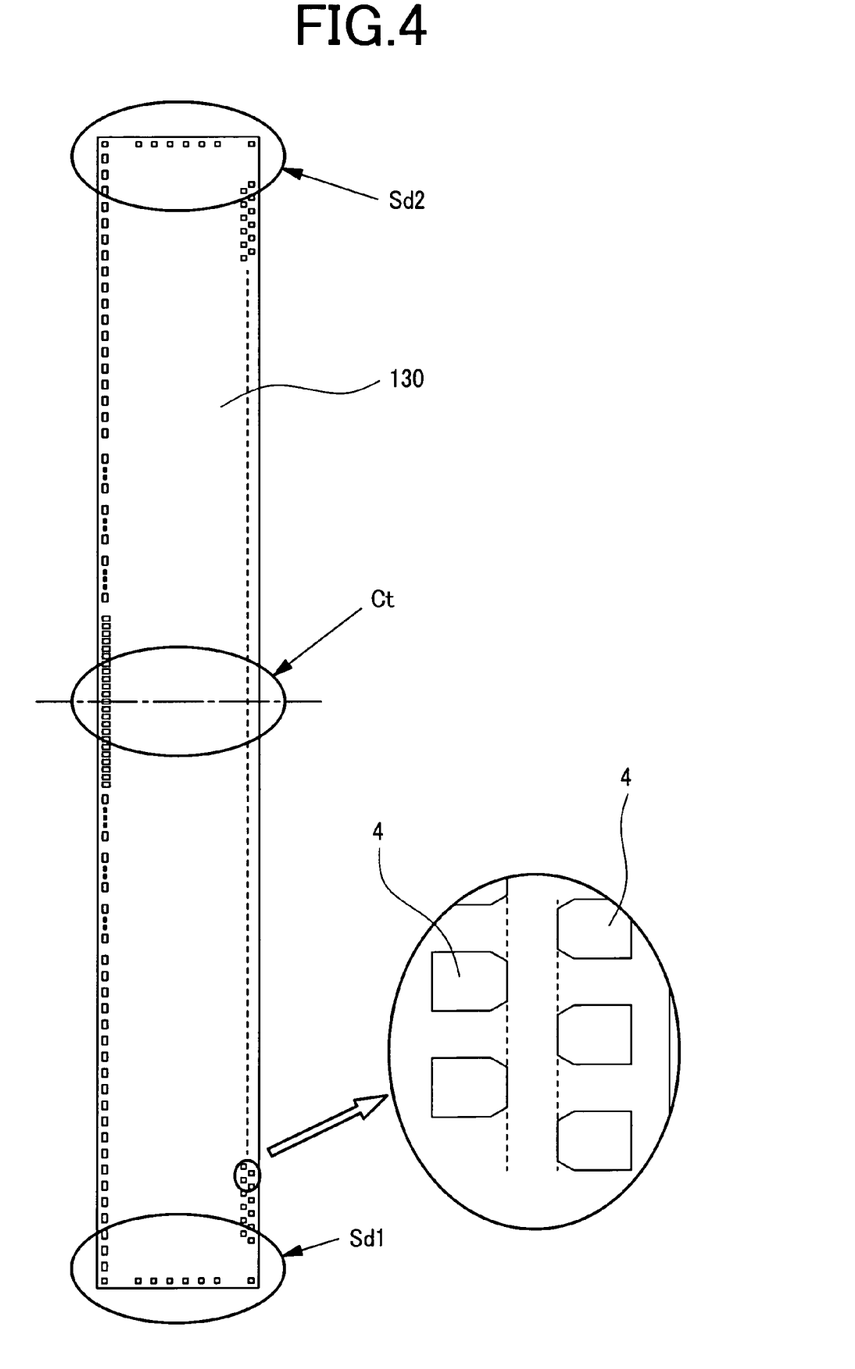
FIG. 4 is a drawing to illustrate one mounting arrangement of bump electrodes of the source driver, in accordance with the liquid crystal display device of FIG. 1.
Figure 5:
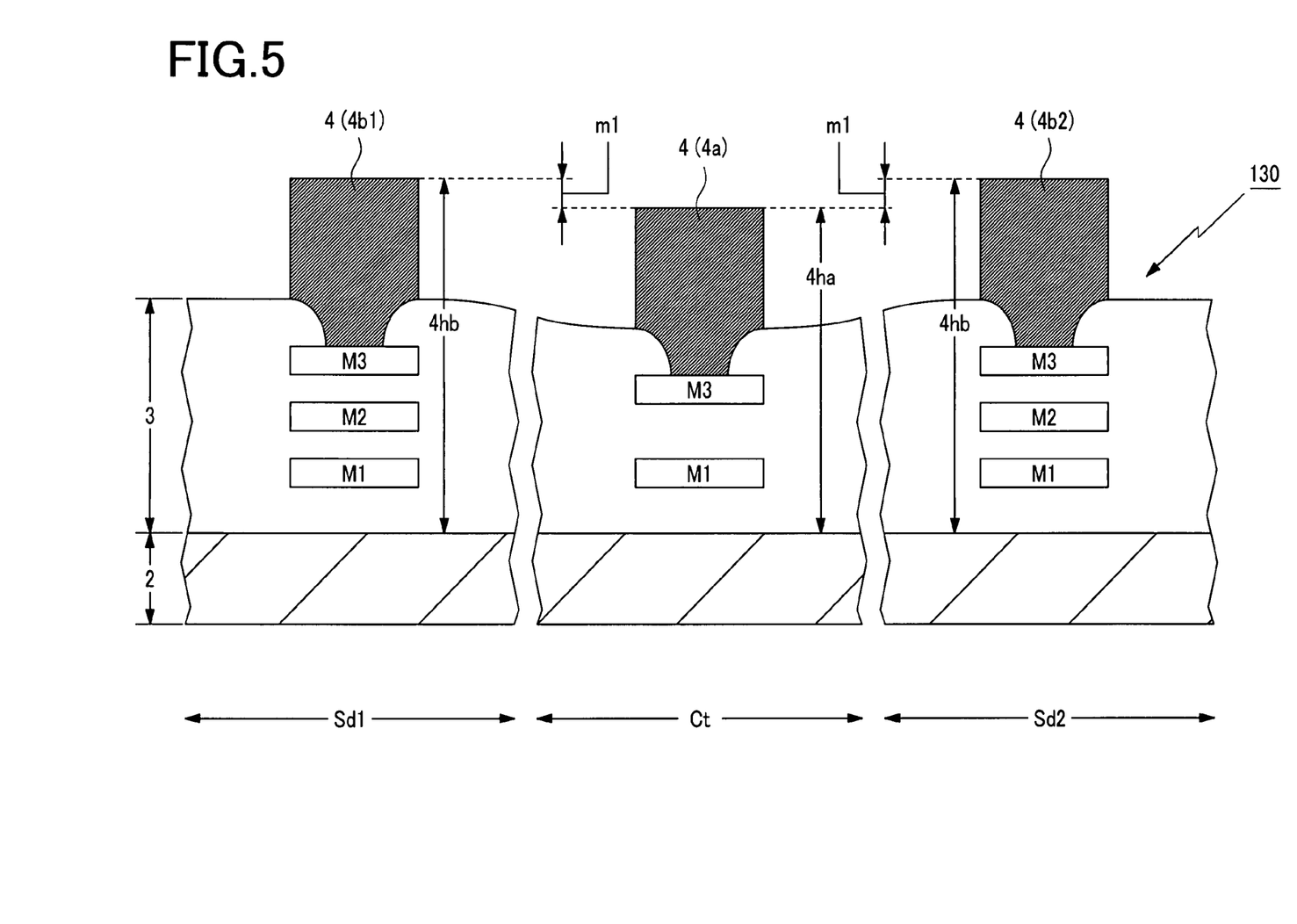
FIG. 5 is a cross-sectional view of the source driver, in accordance with the liquid crystal display device of FIG. 1.

FIG. 4 is a drawing to illustrate one mounting arrangement of bump electrodes of the source driver, and FIG. 5 is a cross-sectional view of the source driver. In detail, FIG. 5 shows cross-sectional structures at three places of FIG. 4 (i.e. an end portion of one side Sd1, the center Ct, and an end portion of the other side Sd2). FIG. 5 illustrates a state in which a source driver warp is not reflected.

Referring to FIG. 4, the source driver 130 has a rectangular planar shape with a short side and a long side. As shown in FIG. 5, the source driver 130 is constituted by a semiconductor substrate 2, a thin film laminate 3 formed on the semiconductor substrate 2, and plural bump electrodes 4 formed on the thin film laminate 3. The thin film laminate 3 has a multi-electrode layer structure obtained by laminating an insulation layer and a conductive layer respectively on the semiconductor substrate 2 to a multi-level.

In this embodiment the thin film laminate 3 has a three-layered conductive structure composed of an electrode layer M1 as the first layer, a conductive layer M2 as the second layer, and a conductive layer M3 as the third layer. At least one of the electrode layer M1 as the first layer, the conductive layer M2 as the second layer, and the conductive layer M3 as the third layer may be a dummy conductive layer (a conductive layer that is not connected to other conductive layers).

The insulation layer is preferably an inorganic insulation film made of silicon oxide or silicon nitride for example, or an inorganic insulation film made of a polyimide resin for example. The conductive layers M1-M3 are preferably metal films made of, for example, aluminum (Al), an aluminum based alloy, copper (Cu), or a copper based alloy. The plural bump electrodes 4 are preferably gold (Au) bumps formed by plating, for example.

As shown in FIG. 4, the plural bump electrodes 4 are arranged along each side of the source driver 130. The plural bump electrodes 4 includes a bump electrode 4a arranged in the vicinity of the center Ct for the longitudinal direction (the long side) of the source driver 130, and bump electrodes 4b1 and 4b2 arranged in the vicinities of end portions (an end portion of one side Sd1 and an end portion of the other side Sd2), respectively, in the longitudinal direction of the source driver 130. As is evident from FIG. 5, the number of conductive layers constituting the thin film laminate 3 under the bump electrodes 4b1 and 4b2 that are arranged in the vicinities of end portions (an end portion of one side Sd1 and an end portion of the other side Sd2) in the longitudinal direction of the source driver 130 is greater than the number of conductive layers constituting the thin film laminate 3 under the bump electrode 4a that is arranged in the vicinity of the center Ct for the longitudinal direction of the source driver 130. In case of this embodiment, the thin film laminate 3 under the bump electrodes 4b1 and 4b2 has a three-layered conductive structure (M1, M2, and M3), while the thin film laminate 3 under the bump electrode 4a has a two-layered conductive structure (M1 and M3).

According to another comparison between the bump electrode 4a arranged in the vicinity of the center Ct for the longitudinal direction of the source driver 130 and the bump electrodes 4b1 and 4b2 arranged in the vicinities of end portions (an end portion of one side Sd1 and an end portion of the other side Sd2) in the longitudinal direction of the source driver 130, height 4hb from the semiconductor substrate 2 to the top (highest point) of the respective bump electrodes 4b1 and 4b2 is greater than height 4ha from the semiconductor 2 to the top of the bump electrode 4a.

Moreover, although a relative position relationship between the bump electrodes 4 and the thin film laminate 3 in a vertical direction defined that the thin film laminate 3 is 'under' the bump electrodes 4, it is the case when the principal surface (the bump formation surface) of the source driver 130 faces upwardly. In other words, if the principal surface of the source driver 130 faces downwardly, one should express that the thin film laminate 3 is 'over' the bump electrodes 4.

Meanwhile, in the ACF mounting the ACF 20 is interposed and heated between the first substrate SUB1 and the source driver 130 to compress the source driver 130, and the conductive particles 21 in the ACF are inserted between the wiring line 162 (D) of the first substrate SUB1 and the bump electrodes 4 of the source driver 130 to connect both (the wiring line and the bump electrodes) electrically and mechanically. Therefore, it is necessary to align the bump electrodes 4 of the source driver 130 to a uniform height, namely, planarizing the plural bump electrodes.

Figure 6:
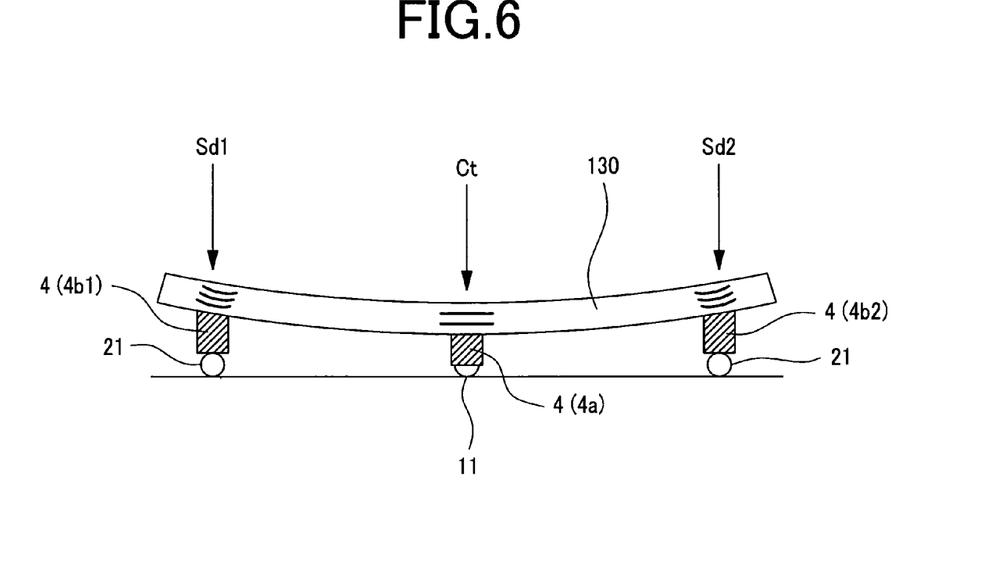
FIG. 6 is a drawing to explain a source driver warpage in accordance with the liquid crystal display device of FIG. 1.

However, as shown in FIG. 6 (this is a drawing for explaining a source driver warpage phenomenon), the principal surface of the source driver 130 (i.e. the bump formation surface where bump electrodes are formed) is warped in a convex manner. In result of the warpage, the bump electrode 4a arranged in the vicinity of the center Ct for the longitudinal direction of the source driver 130 has a different height from the other bump electrodes 4ba and 4b2 arranged in the vicinities of end portions (an end portion of one side Sd1 and an end portion of the other side Sd2), respectively, in the longitudinal direction of the source driver 130. The nonuniform heights of the bump electrodes 4 cause connection failure between the wiring line 162 (D) formed on the first substrate SUB1 and the bump electrodes 4 of the source driver 130, or unstable connection resistance therebetween (between the wiring lines and the bump electrodes) and degrade the reliability of a liquid crystal display device, so there is a need to resolve these concerns.

Meanwhile, since the nonuniform heights of the bump electrodes 4 are influenced by flatness of the thin film laminate 3 under the bump electrodes 4, a planarization process is carried out to manufacture the source driver 130. Even so, the thin film laminate 3 in reality cannot be perfectly flat as designed.

Figure 8A:
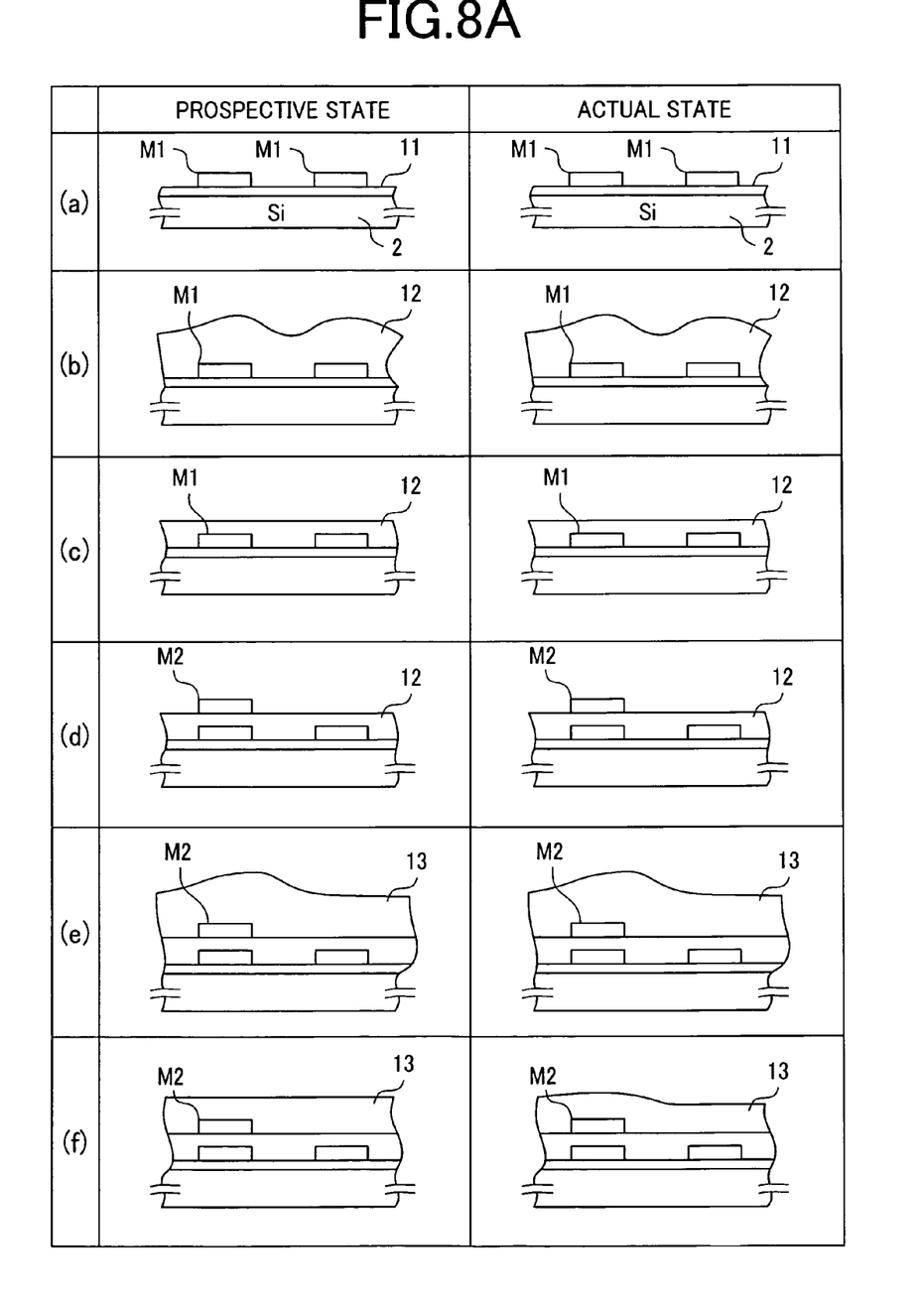
FIG. 8A illustrates a fabrication method of the embodiment 1 of the present invention in sequence of (a)-(f) processes.
Figure 8B:
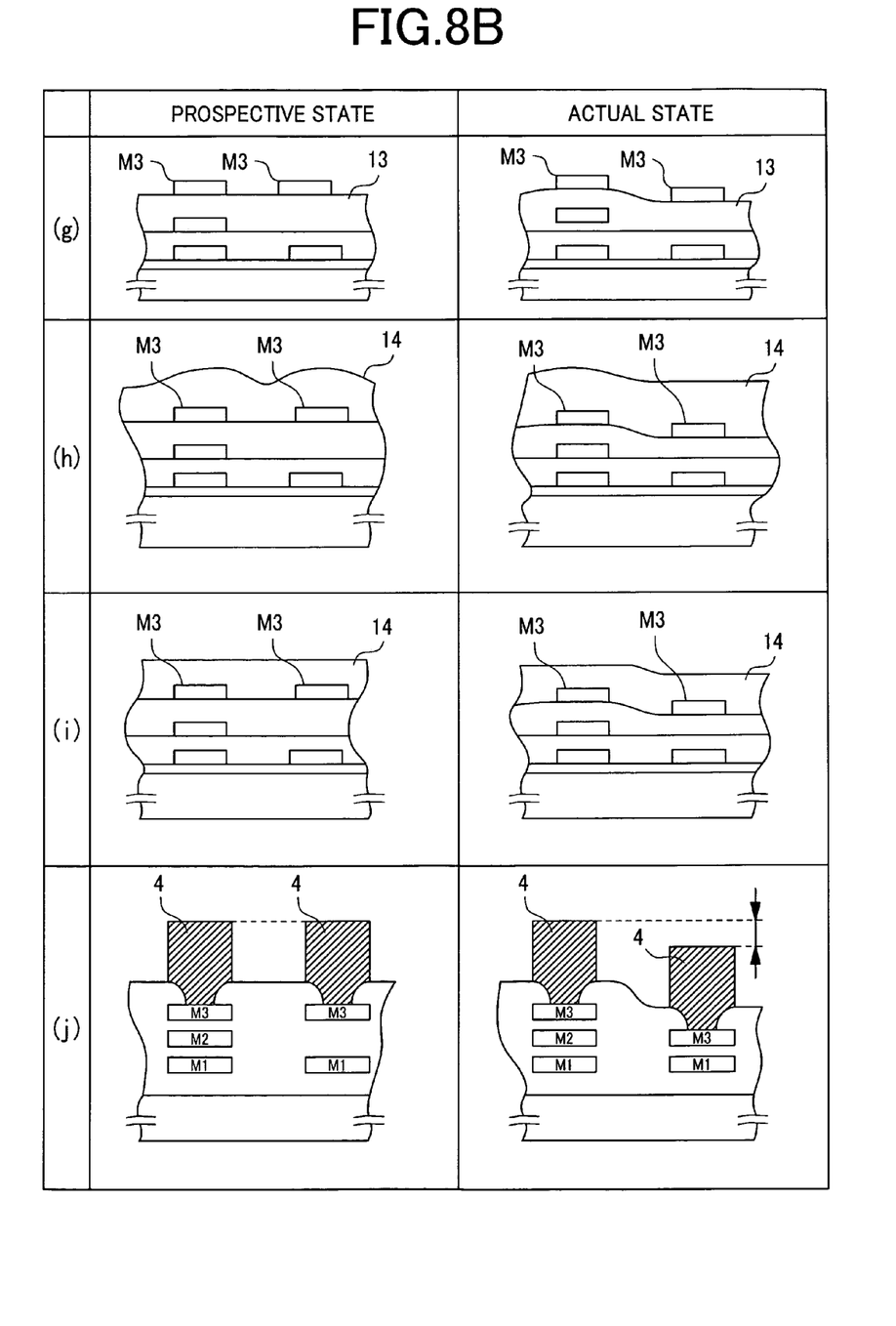
FIG. 8B illustrates a fabrication method of the embodiment 1 of the present invention in sequence of (g)-(j) processes.

FIG. 8A and FIG. 8B illustrate a method for manufacturing a thin film laminate according to one embodiment of the present invention, in which FIG. 8A shows a sequence of processes from (a) through (f) and FIG. 8B shows a sequence of processes from (g) through (j). In FIG. 8A and FIG. 8B, the drawings on the left hand side show prospective states as designed, while the drawings on the right hand side show real states as the manufacturing procedure progresses.

Process (a):
An insulation layer 11 is formed on a semiconductor substrate 2, and a conductive layer M1 is formed on the insulation layer 11.

Process (b):
An insulation layer 12 is formed over the insulation layer 11 in a way to encompass the conductive layer M1.

Process (c):
Surface of the insulation layer 12 is planarized by CMP (Chemical Mechanical Polishing) or the etch-back method.

Process (d):
A conductive layer M2 is formed on the planar insulation layer 12.

Process (e):
An insulation layer 13 is formed over the insulation layer 12 in a way to encompass the conductive layer M2.

Process (f):
Surface of the insulation layer 13 is planarized by CMP or the etch-back method.

Process (g):
A conductive layer M3 is formed on the planar insulation layer 13.

Process (h):
An insulation layer 14 is formed over the insulation layer 13 in a way to encompass the conductive layer M3.

Process (i):
Surface of the insulation layer 14 is planarized by CMP or the etch-back method.

Process (j):
Bonding openings are formed at the insulation layer 14, and surface of the bump electrodes 4 is planarized.

As shown in FIG. 8A and FIG. 8B, the planarization process does not guarantee a flat surface of the bump electrodes 4 with a uniform height as designed if different numbers of conductive layers are formed over the bump electrodes (assuming the bump formation surface of a semiconductor chip constituting the source driver 130 as a lower side).

Therefore, this embodiment suppresses the non-uniformity in heights of the bump electrodes 4 caused by the source driver 130 warpage in the vicinity of the center Ct and in the vicinities of end portions (an end portion of one side Sd1 and an end portion of the other side Sd2) in the longitudinal direction of the source driver 130, by intentionally changing the number of layers of the conductive layers for the thin film laminate 3 over the bump electrodes (assuming the bump formation surface of a semiconductor chip constituting the source driver 130 as a lower side).

Figure 7:
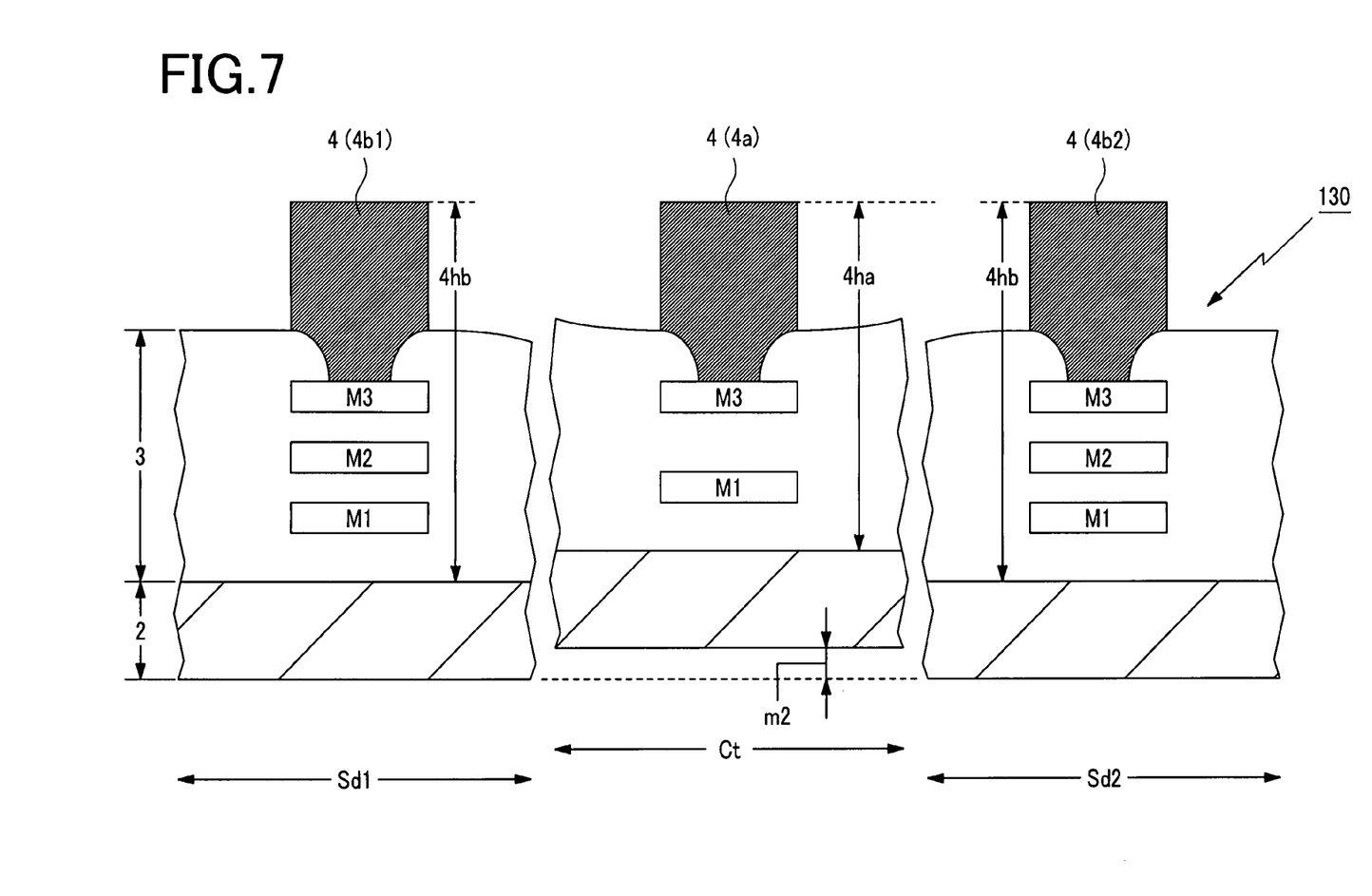
FIG. 7 is a cross-sectional view illustrating the source driver of FIG. 5 having a source driver warp reflected therein.

The reason will now be explained below with reference to FIGS. 5-7. FIG. 7 is a cross-sectional view reflecting the source driver warpage in FIG. 5.

Referring to FIG. 6, the principal surface (the bump formation surface) of the source driver 130 is warped in a convex direction. In this case, the central portion Ct for the longitudinal direction of the source driver 130 is protruded more than the end portions (an end portion of one side Sd1 and an end portion of the other side Sd2).

Meanwhile, despite the use of the planarization process, height from the semiconductor substrate 2 to the top of the bump electrodes 4 varies by the number of conductive layers for the thin film laminate 3 under the bump electrodes 4. Referring to FIG. 5, in case of this embodiment the thin film laminate 3 under the bump electrodes 4b1 and 4b2 has a three-layered conductive structure (M1, M2, and M3), while the thin film laminate 3 under the bump electrode 4a has a two-layered conductive structure (M1 and M3).

A comparison between the bump electrode 4a arranged in the vicinity of the center Ct for the longitudinal direction of the source driver 130 and the bump electrodes 4b1 and 4b2 arranged in the vicinities of end portions (an end portion of one side Sd1 and an end portion of the other side Sd2) in the longitudinal direction of the source driver 130 indicates that height 4hb from the semiconductor substrate 2 to the top of the respective bump electrodes 4b1 and 4b2 is greater than height 4ha from the semiconductor 2 to the top of the bump electrode 4a.

In short, the non-uniformity in heights of the bump electrodes 4 due to the source driver 130 warpage as reflected in FIG. 7 can be suppressed by intentionally changing the number of conductive layers for the thin film laminate 3 over the bump electrodes 4 based on how much the source driver 130 is warped.

In FIG. 5, m1 designates a height difference of the bump electrodes 4. In FIG. 7, m2 designates a degree of warpage of the source driver 130. To make the height difference m1 and the degree of warpage m2 even, it is preferable to change the number of conductive layers for the thin film laminate 3 over the bump electrode 4a arranged in the vicinity of the center Ct for the longitudinal direction of the source driver 130 as well as the number of conductive layers for the thin film laminate 3 over the bump electrodes 4b1 and 4b2 arranged in the vicinities of end portions (an end portion of one side Sd1 and an end portion of the other side Sd2) in the longitudinal direction of the source driver 130.

Accordingly, the non-uniformity in heights of the bump electrodes 4 caused by the source driver 130 warpage is suppressed, problems such as the connection failure between the wiring line 162 (D) formed on the first substrate SUB1 and the bump electrodes 4 of the source driver 130, or unstable connection resistance therebetween (between the wiring lines and the bump electrodes) can be prevented and thus, the reliability of a liquid crystal display device is improved.

Although this embodiment explained the application of the present invention to the source driver 130, the present invention is not limited thereto but may also be applied to the gate driver 140.

Embodiment 2

Figure 9A:
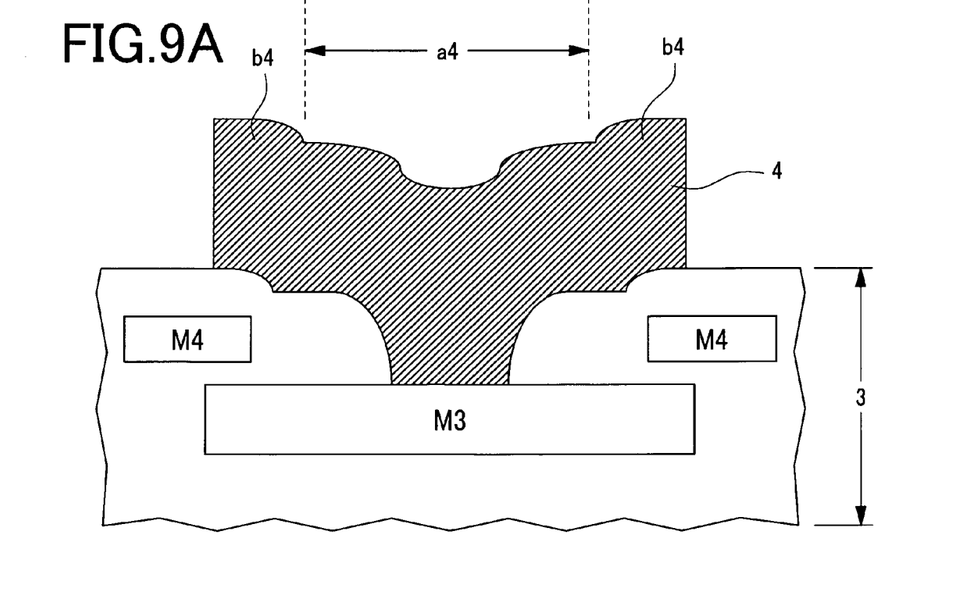
FIG. 9A is a cross-sectional view of a bump electrode for a source driver used for a liquid crystal display device in accordance with an embodiment 2 of the present invention.
Figure 9B:
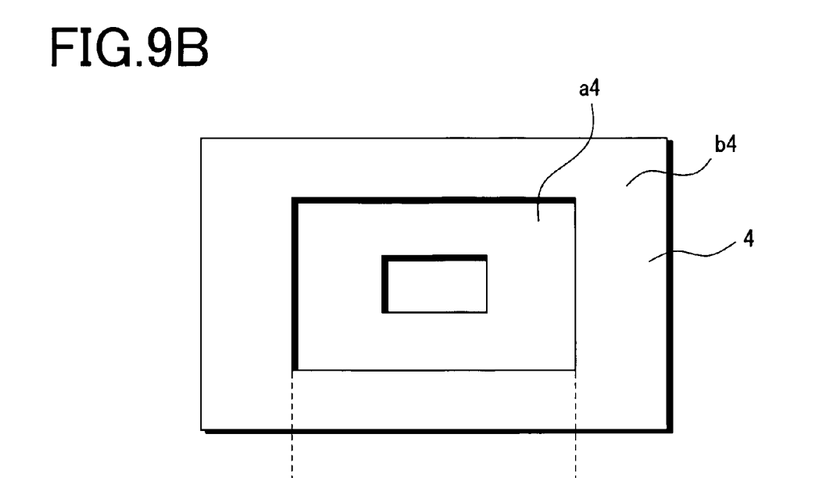
FIG. 9B is a plan view of a bump electrode for a source driver used for a liquid crystal display device in accordance with an embodiment 2 of the present invention.

FIG. 9 is a structural view of a bump electrode for a source driver ((a) is a cross-sectional view and (b) is a plan view) used for a liquid crystal display device in accordance with an embodiment 2 of the present invention.

The liquid crystal display of the embodiment 2 is different from the liquid crystal display of the embodiment 1 as follows.

Referring to FIG. 9, each of the plural bump electrodes 4 is arranged at the center a4 and in the vicinities of the center a4, and a peripheral portion b4, being higher than the center a4, has a greater number of conductive layers for the thin film laminate 3 under the center a4 of the bump electrodes 4.

In case of this embodiment, the thin film laminate 3 under the peripheral portion b4 of the bump electrodes 4 has a four-layered conductive structure (M1, M2, M3, and M4), while the thin film laminate 3 at the center a4 of the bump electrodes 4 has a three-layered conductive structure (M1, M2, and M3).

As discussed earlier, in the ACF mounting an ACF 20 is interposed and heated between a first substrate SUB1 of a liquid crystal display panel and a source driver 130 to compress the source driver 130, and conductive particles 21 in the ACF are inserted between wiring line 162 (D) of the first substrate SUB1 and bump electrodes 4 of the source driver 130 to connect both (the wiring line and the bump electrodes) electrically and mechanically. Therefore, it is necessary to keep the conductive particles 21 securely held between both during the compression, in other words, to insert as many conductive particles 21 as possible therebetween.

Therefore, this embodiment changed part of the number of conductive layers for the thin film laminate 3 under the bump electrodes 4 such that the peripheral portions b4 of the bump electrodes 4 are higher than the center a4. At the time of mounting the source driver 130 according to the ACF mounting method, this particular structure can suppress the escape of the conductive particles 21 in ACF from between the wiring line 162 (D) of the first substrate SUB1 and the bump electrodes 4 of the source driver 130. In other words, since more conductive particles 21 can be inserted between both (the wiring line and the bump electrodes), mounting reliability of the source driver 130 as well as reliability of a liquid crystal display device can be improved.

Since connection resistance between the wiring line 162 (D) of the first substrate SUB1 and the bump electrodes 4 of the source driver 130 depends on the number of the conductive particles 21 inserted therebetween, it is important to lower the connection resistance by inserting as many conductive particles 21 as possible therebetween.

Although this embodiment explained the application of the present invention to the source driver 130, the present invention is not limited thereto but may also be applied to the gate driver 140.

While the invention has been shown and described with reference to certain preferred embodiments thereof, it will be understood by those skilled in the art that various changes in form and details may be made therein without departing from the spirit and scope of the invention as defined by the appended claims.

For instance, the embodiments of the present invention is not limited to a liquid crystal display device, but can be applied to an organic EL display device and so on.

What is claimed is:

1. A semiconductor chip comprising:
a semiconductor substrate having a short side and a long side;
a plurality of bump electrodes formed over the semiconductor substrate, and arranged along the long side,
wherein the plurality of bump electrodes include a first bump electrode arranged in the vicinity of a center portion of the long side and a second bump electrode arranged in the vicinity of an end portion of the long side,
wherein the height from the semiconductor substrate to the second bump is greater than the height from the semiconductor substrate to the first bump,
wherein the first bump and the second bump are connected to a substrate of a display device through an anisotropic conductive film,
wherein the semiconductor chip comprises one or more than one metal layers between the semiconductor substrate and the plurality of bump electrodes,
wherein the number of the metal layers between the semiconductor substrate and the second bump is greater than the number of the metal layers between the semiconductor substrate and the first bump, and
wherein the metal layers between the second bump and the semiconductor chip comprise a dummy layer.

2. A semiconductor chip according to claim 1, wherein the first bump and the second bump are formed on one of the metal layers, and the height of the first bump and the height of the second bump from one of the metal layers are the same.

* * * * *